United States Patent [19]

Nishizawa

[11] 4,259,681

[45] Mar. 31, 1981

[54] INTEGRATED CIRCUIT

[75] Inventor: Jun-ichi Nishizawa, Sendai, Japan

[73] Assignee: Zaidan Hojin Handotai Kenkyu Shinkokai, Sendai, Japan

[21] Appl. No.: 921,565

[22] Filed: Jul. 3, 1978

Related U.S. Application Data

[63] Continuation-in-part of Ser. No. 748,292, Dec. 7, 1976, abandoned.

[30] Foreign Application Priority Data

Dec. 9, 1975 [JP] Japan ................................ 50/146588

[51] Int. Cl.³ ............................................ H01L 27/02
[52] U.S. Cl. ........................................ 357/41; 357/22; 357/36; 357/43; 357/46; 357/55; 357/92

[58] Field of Search ....................... 357/22, 92, 36, 43, 357/46, 55

[56] References Cited

U.S. PATENT DOCUMENTS 3,978,515  8/1976  Evans et al. ........................... 357/22

Primary Examiner—Edward J. Wojciechowicz
Attorney, Agent, or Firm—Cushman, Darby & Cushman

[57] ABSTRACT

An integrated circuit comprising an inversely operated static induction transistor capable of performing very high speed operation at low power dissipation. In an integrated injection logic circuit, at least one of the injection and the output transistor is formed of a static induction transistor which has small storage effect of minority carriers in the channel region.

24 Claims, 30 Drawing Figures

INTEGRATED CIRCUIT

CROSS REFERENCE TO RELATED APPLICATION

This is a continuation-in-part of my copending application Ser. No. 748,292 filed on Dec. 7, 1976, abandoned after the filing hereof.

BACKGROUND OF THE INVENTION

1. Field of the Invention:

The invention relates to an integrated circuit and more particularly to an integrated circuit capable of high speed operation and low power dissipation.

2. Description of the Prior Art

In conventional integrated circuits including bipolar transistors, emitter, base and collector of each transistor are usually disposed in one principal surface for simplifying the interconnection of the respective elements. In such arrangements, however, collectors of the respective transistors should be isolated by pn-junctions or oxide (or insulator) regions. This makes the number of manufacturing processes large, and the structure itself complicated and the accurate and rapid manufacture of integrated circuits difficult. FIG. 1 prior art shows part of a conventional integrated circuit. Two transistors $Tr_1$ and $Tr_2$ have similar structure. In each transistor, heavily doped n+-type regions 2 and 3 are formed in an n-type semiconductor layer 1. The n+-type region 2 forms a collector contact region for forming an ohmic metal-semiconductor contact with the collector electrode 4 and another n+-type region 3 serves to reduce the collector resistance of the transistor. A p-type base region 5 is formed in a surface portion of the layer 1 on the same side as the collector contact region 2. A heavily doped n+-type emitter region 7 is formed in a surface portion of the p-type base region 5. A base electrode 6 and an emitter electrode 8 are formed on the base and the emitter regions 5 and 7. The n-type layer 1 serves as a collector region. Since the transistors $Tr_1$ and $Tr_2$ are formed in a same semiconductor wafer adjacent to each other, an isolating p-type region 9 is needed therebeteen for electrically separating the transistors $Tr_1$ and $Tr_2$. The isolating p-type region 9 may be replaced by an oxide region or by any high resistivity member.

Suppose that an electronic circuit as shown in FIG. 2 prior art is to be formed in an integrated circuit. When the conventional structure as shown in FIG. 1 is adopted, four discrete transistor structures each being similar to the transistor $Tr_1$ of FIG. 1 are required for forming four output transistors besides a driving (load) transistor shown on the left side of FIG. 2. Electrical connections among the respective transistors will be achieved with metal layers deposited on the surface. According to such structure, a considerably large area is needed for forming four discrete transistors, each being provided with isolating regions thereberound. The total structure of such semiconductor elements and the mutual wiring leads deposited on the surface become also complicated.

For solving the above drawbacks and also for enhancing the operation speed, there have been proposed the integrated injection logic (IIL) circuit or the merged transistor logic (MTL) circuit (C. M. Hart and A. Slob: "Integrated Injection Logic-A New Approach to LSI" ISSCC Tech. Digest, p. 92-93, Feb. 1972, and H. H. Berger and S. K. Wiedman: "Merged Transistor Logic—A Low Cost Bipolar Logic Concept" Ibid, p. 90-91). Usual IIL circuit utilizes the inversely operated multi-collector transistor as shown in FIGS. 3A and 3B, in which FIG. 3A shows the structure in a semiconductor chip and FIG. 3B is the circuit diagram.

Namely, five discrete transistors in FIG. 2 are integrated into one composite structure. In FIG. 3A p-type regions 10 and 11 are formed in an n-type region 1, and n+-type regions 13a, 13b, 13c and 13d are formed in the p-type region 11. The p-type region 10, the n-type region 1 and the p-type region 11 constitute emitter, base and collector regions of the injector transistor, while the n-type region 1, the p-type region 11 and the n+-type regions 13a to 13d constitute emitter, base and multi-collector regions of the output (switching) multi-collector transistor. No isolating regions one formed in the composite structure. In integrated logic circuits, such composite structures are usually connected sequentially by connecting the collector of the switching transistor to the base of a succeeding switching transistor.

In operation, the injector transistor supplies current to the base region of the switching transistor which is usually connected to the collector of a preceding switching transistor. When the preceding switching transistor is turned off, the collector potential (i.e. $V_{in}$) is raised to the high level. The current flowing through the pnp lateral injection transistor, therefore, flows into the base region of the switching transistor. Then, the carriers injected from the pnp injector transistor to the base region of the npn switching transistor raises the base potential and turns the switching transistor on. On the other hand, when the preceding switching transistor is turned on, the collector potential ($V_{in}$) is lowered to the low level. Then, the carriers injected from the pnp injector transistor into the base region of the npn switching transistor are allowed to flow through the switching transistor of the preceding stage, without raising the base potential of the switching transistor of the present stage. Thus, an IIL structure performs an inverter action.

In such an integrated injection logic circuit, the structure is greatly simplified as seen in FIG. 3A and also the power-delay product becomes small. However, there still remains the storage effect of minority carriers. Also, in the inversely operated bipolar transistor, the relation of the impurity concentration in the emitter and the collector regions is usually reversed. Therefore, the characteristics of the device become worse, though the elimination of the external emitter wiring often overcomes this drawback.

From the view point of operation speed, bipolar integrated circuits are generally superior to MOS integrated circuits, while the MOS integrated circuits are generally superior to the bipolar integrated circuits with regard to the power dissipation and the packing density.

FIG. 4 shows an example of the characteristic curves of a bipolar transistor, in which the abscissa represents the emitter-collector voltage, and the ordinate the collector current. Connecting a load resistance in series with the collector or with the emitter, the operational characteristic (load line) becomes a line AB or AB', where the point A represents the supply voltage. The operational point moves along the line AB or AB' in accordance with the signal voltage applied between the emitter and the base. In logic circuits, the case where such lines as AB are adopted as the operational line is called unsaturated logic, and the case where such lines as AB' are adopted is called saturated logic. The unsaturated logic has the advantage that the operation speed is high but a disadvantage that the power dissipation is large. While the saturated logic has the advantage that the power dissipation is small, but a disadvantage that the operation speed is low. In either case, the operation speed is almost limited by the storage effect of minority carriers. At the present stage, the time delay (propagation delay) achievable with the IIL circuit is of the order of 10 to 20 nanosec., and the power dissipation per gate is of the order of 100 microwatts ($\mu$W), thus the power-delay product ranging around 1 picojule (pJ). In short, in the conventional bipolar transistors, the storage effect of minority carriers is large and limits the operation speed.

For solving this problem, complementary constant current logic ($C^3L$) circuits utilizing Schottky junctions in collector junctions have been proposed, but the operation speed thereof is still not high enough.

Furthermore, current mode logic (CML), non-threshold logic (NTL), diode-transistor logic (DTL), direct-coupled transistor logic (DCTL), transistor-transistor logic (TTL), etc. have been developed. But, the power-delay products of these logics are greater at least by one order than that of the IIL circuit at the present stage even if the propagation delay is superior to IIL circuit in the same logic circuits. This is due mainly to the considerable amount of the storage effect of minority carriers and the low integration density.

SUMMARY OF THE INVENTION

Therefore, an object of this invention is to provide a semiconductor integrated circuit having a very rapid operation speed.

Another object of this invention is to provide a semiconductor integrated circuit having a simple structure and capable of performing a very rapid operation at a low power dissipation.

A further object of this invention is to provide an integrated injection type semiconductor integrated circuit comprising a static induction transistor having a characteristic represented by a very high packing density.

According to an aspect of this invention, there is provided a semiconductor integrated circuit structure formed in one semiconductor chip and including a plurality of active elements, comprising at least one static induction transistor as one of said active elements.

The static induction transistor proposed by the present inventor (J. NISHIZAWA; IEEE Trans. Electron Devices ED-22, No. 4, pp. 185-197, April 1975) has such advantages that the storage effect is small and that the negative feedback effect due to series channel resistance is suppressed to an extremely small value. More particularly, the static induction transistor has a very short channel length and also a short source-to channel length so that the series resistance from the source electrode to the intrinsic gate which contributes to the negative feed-back action is suppressed sufficiently small. In the static induction transistor, the channel is consisted of a low impurity concentration region so that the current is controlled mainly by the electrostatic induction effect of the gate and drain voltages. In such static induction transistor, even when the current channel is pinched off only by the gate bias voltage resulting in the appearance of a potential barrier in the channel, a drain current is allowed to flow by increasing the drain voltage whereby the barrier height is lowered.

FIG. 5A shows an example of the characteristic curves of a static induction transistor, in which the abscissa represents the drain voltage and the ordinate the drain current. When the gate bias is increased appropriately in a forward direction in which case there exists a remarkable minority carrier injection from the gate to the channel, the current voltage characteristic differs from that shown in FIG. 5A and exhibits a rather saturation-type characteristic as shown in FIG. 5B. In FIG. 5B, the drain current begins to saturate at the drain voltage of 0.1-0.3V, while the bipolar transistor exhibits saturation of the collector current at the collector voltage of 0.2-0.4V. The transfer characteristic of the static induction transistor having the I-V characteristic shown in FIG. 5B is illustrated in FIGS. 5C and 5D, wherein the load is formed by a resistor in FIG. 5C, whereas it is formed by a bipolar transistor shown in FIG. 5D.

As shown in the Figure, the static induction transistor has such as unsaturated characteristic at least in a low drain current region that the drain current $I_d$ increases progressively with an increase in the drain voltage $V_d$. The operational characteristic (load line) of the static induction transistor is selected on a line such as AB. The static induction transistor has similar advantages as those of the saturated type MOS transistor that the input impedance is high and the required driving power is extremely small as compared to the bipolar transistor even if the bias voltage is applied in the forward direction to the gate of a junction static induction transistor because the current gain in the SIT is much higher than that in the bipolar transistor. Furthermore, due to the operation principle of controlling the injection of majority carriers by the potential distribution in the channel, which potential distribution is controllable by both the gate bias voltage and the drain voltage, the static induction transistor is almost free from the problem of minority carriers storage in case the forward gate bias voltage. Furthermore, the channel region has a low impurity concentration, and the gate and the drain regions usually may have a small size so that both the gate and the drain capacitances can be suppressed to very small levels. Therefore, a very high speed operation can be provided.

The powder-delay (PD) product of an integrated circuit using a static induction transistor is analysed as follows.

Power P is represented by the product of voltage and current I, $P=VI$, and delay time D by the time constant, $D=RC$, wherein R represents resistance and C capacitance. In the region of a relatively small current density, the current voltage characteristic of a static induction transistor is given by $$I \alpha \exp[qV/\eta kT]$$

wherein: q represents the absolute value of the unit electron charge; $\eta$ a numerical coefficient nearly equal to 1; k the Bolzmann constant; and T the absolute temperature. This relation is derived from the fact that in the static induction transistor, the drain current is controlled mainly by the potential barrier height in the channel. When a small signal voltage $\tilde{V}$ is superposed on the biasing voltage $V_O$, the current becomes:

$$I = I_0 + \tilde{I} \propto \exp[q(V_0 + \tilde{V})/\eta kT]$$
$$= \exp[(qV_0/\eta kT)(1 + \tilde{V}/V_o)]$$
$$\approx \exp[qV_0/\eta kT] \cdot (1 + \frac{q\tilde{V}}{\eta kT})$$

to the first order approximation. Thus, $$\tilde{I} = I_0 \cdot (q/\eta kT) \cdot \tilde{V}.$$

In this state, the resistance R is given by $$R = dV/dI = \eta KT/I_0 q.$$

From these equations, the PD product is given by $$PD = I_0 V_0 \cdot RC = I_0 V_0 \cdot \frac{\eta kT}{I_0 q} \cdot C$$
$$= \frac{\eta kT}{q} \cdot V_0 C.$$

When the drain is arranged to be several micrometers square, the capacitance C can be easily suppressed to at least the order of 0.1 pF. If the supply voltage is lowered below 1 volt as in the usual IIL circuit, the PD product of the static induction transistor will naturally decrease further to about $1 \times 10^{-15} J = 1 \ fJ$. It can be seen that this PD product is far smaller than that of the bipolar IIL circuit which has the least PD product among the bipolar transistor logic circuits.

The static induction transistor is suited for being formed in vertical structures due to its short channel structure, which provides the great advantage of high packing density in integrated circuits. Furthermore, the flow of charge carriers in the static induction transistor has a so-called "converging" property due to the potential profile established therein, which enables one to make the drain region in a small size without being accompanied by a decrease in the current transport factor and thereby featured by a large fan-out. This advantage can be fully utilized in integrated circuits including upside-down transistors (inversely configurated transistor) as in the IIL structures. Also, there arises no problem of undesirable correlation of impurity concentration between the respective regions as encountered in upside-down bipolar transistors, i.e., the impurity concentration of emitter region is much less than that of base region. Therefore, in high-density integrated circuits, the static induction transistors will positively play a very important rôle. Namely, the integrated circuit including static induction transistors according to this invention has the advantages represented by high speed which is the feature of the bipolar transistor integrated circuits, and also by low dissipation which is the feature of MOS integrated circuits, as well as the advantage represented by high packing density.

Furthermore, the static induction transistor can also be formed in MOS type or Schottky type. Similar advantages can be obtained with these static induction MOS transistor and static induction Schottky transistor. When the drain is formed by a Schottky junction, the storage effect in the drain can be neglected also, and a remarkable speed-up operation can be expected.

Also, a capacitance may be connected in parallel to the series resistance of the static induction transistor so as to short-circuit the high frequency components thereacross.

According to an embodiment of this invention, an upside-down static induction transistor has a recessed portion around the drain, and the gate structure is formed in this recessed portion. This "recessed" (or off-set) gate structure is capable of reducing the gate capacitance and also it can raise the amplification factor and the transconductance as compared to the flat gate structure. This reduction in the gate capacitance and the increase in the transconductance lead to a further improvement of the operation speed. Therefore, the recessed gate structure is suitable for a very high speed integrated circuit.

According to another embodiment of this invention, the source region of a static induction transistor has a projection extending toward the drain region. This projection shortens the source-to-drain transit time of charge carriers, and increases the transconductance, as well as prevents the deviation of the depletion layer near the source region if the shape of the heavily doped source region is formed to follow the shape of the depletion layer. This projection contributes also to increasing the operation speed, and helps reduction of the distortion in signal transfer.

Other objects, features and advantages of this invention will become apparent from the following detailed description of the preferred embodiments when taken in conjunction with the accompanying drawings.

DETAILED DESCRIPTION OF THE PREFERRED EMBODIMENTS

Figure 1:
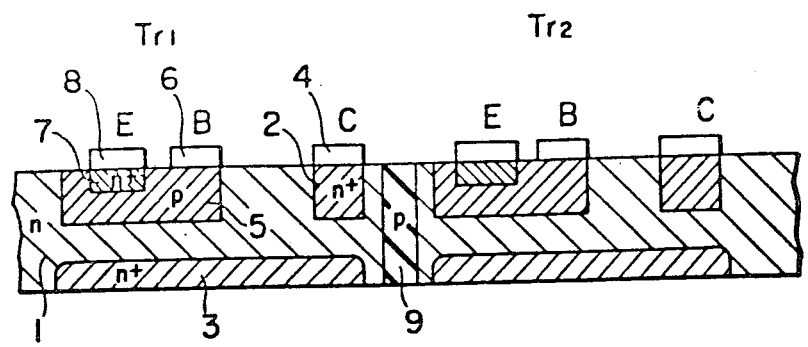
FIG. 1 is a diagrammatic sectional view of conventional bipolar transistor structures in a semiconductor integrated circuit.
Figure 2:
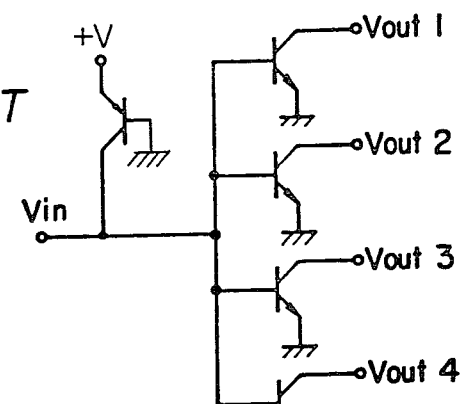
FIG. 2 is a circuit diagram of a conventional logic circuit utilizing discrete transistors.
Figure 3A:
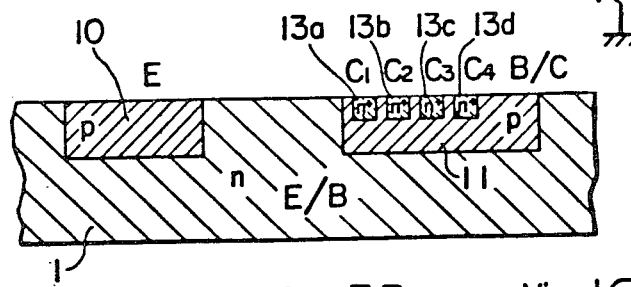
FIGS. 3A and 3B are a diagrammatic partial sectional view and a circuit diagram of a conventional IIL circuit.
Figure 3B:
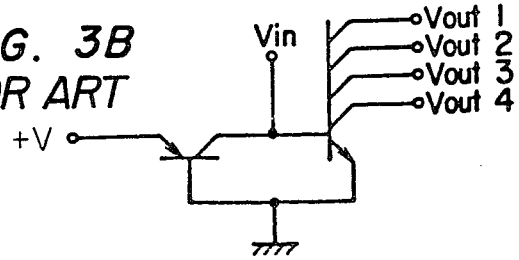
Figure 4:
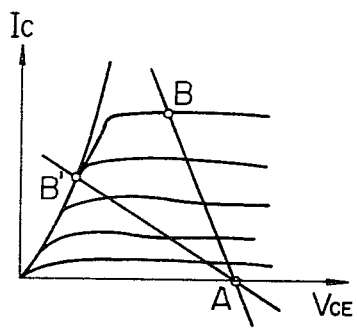
FIG. 4 is a chart of characteristic curves of a conventional bipolar transistor.
Figure 5A:
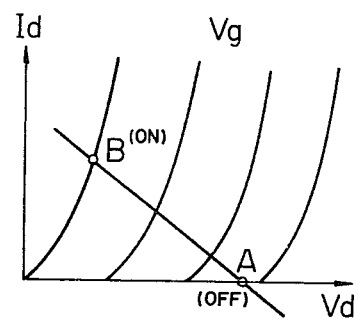
FIGS. 5A and 5B are charts of characteristic curves of a static induction transistor previously proposed by the present inventor.
Figure 5B:
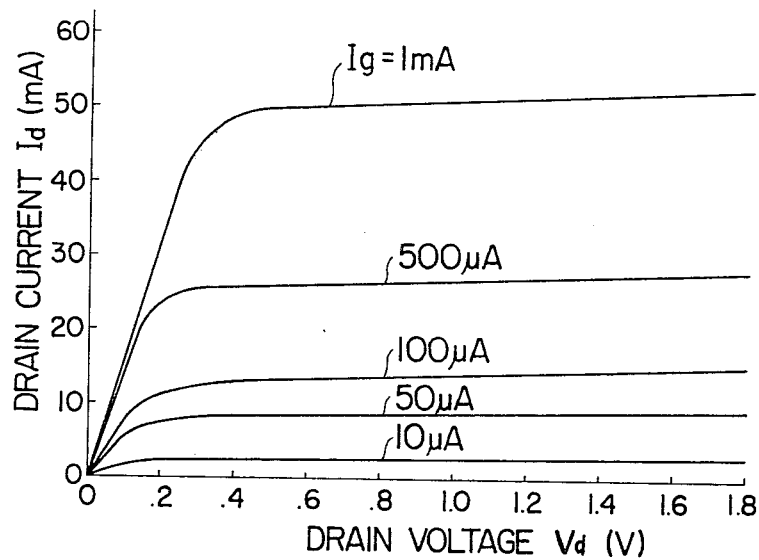
Figure 5C:
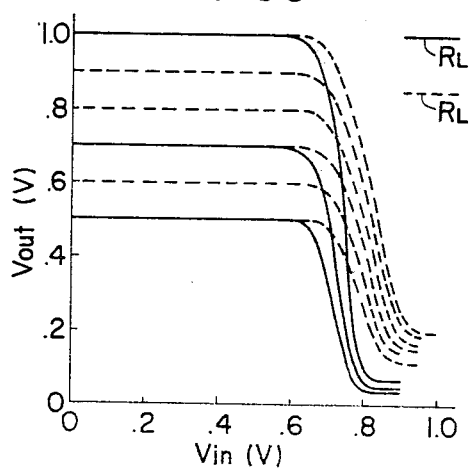
FIGS. 5C and 5D are charts of transfer characteristics of the static induction transistor, the I-V characteristic of which is shown in FIG. 5B.
Figure 5D:
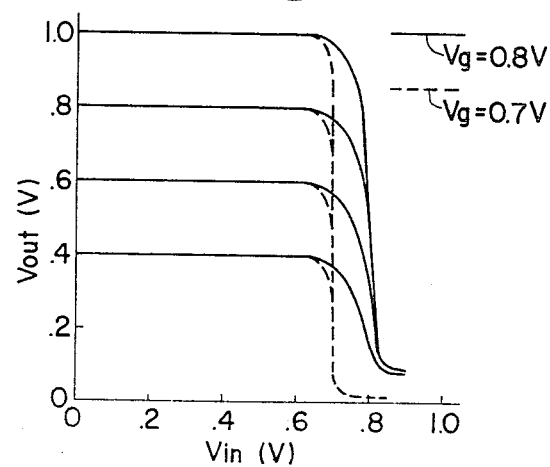
Figure 6A:
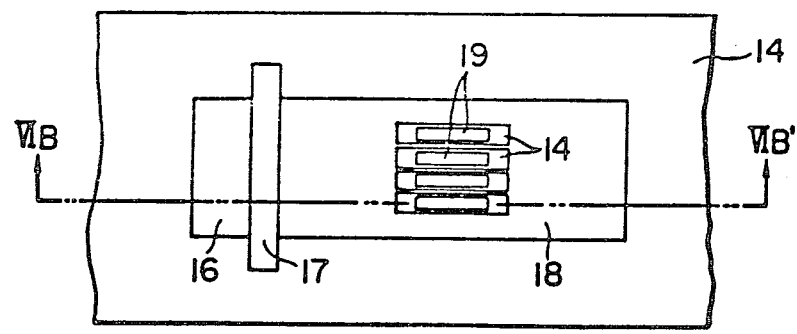
FIGS. 6A and 6B are a diagrammatic top-plan view and a section of an integrated circuit structure according to an embodiment of this invention, respectively.
Figure 6B:
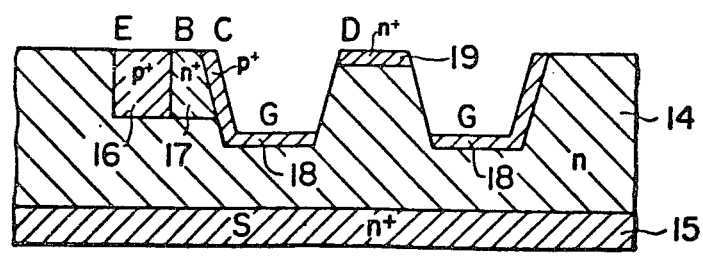

FIGS. 6A and 6B show an embodiment of an integrated circuit having an inversely operated static induction transistor, in which FIG. 6A is a top view and FIG. 6B is a section taken along the line VIB-VIB' in FIG. 6A.

The integrated circuit has one input and four outputs. The integrated circuit comprises an n-type epitaxial layer 14 having an impurity concentration of $10^{12}$ to $10^{16}$ atoms/c.c. and grown on a substrate including an n-type heavily doped source region 15 having an impurity concentration of $10^{18}$ to $10^{20}$ atoms/c.c.. In the surface portion of the nearly intrinsic n-type layer 14, is formed a transistor structure consisting of a p-type heavily doped emitter region 16 having an impurity concentration of $10^{18}$ to $10^{20}$ atoms/c.c., an n-type heavily doped base region 17 having an impurity concentration of $10^{17}$ to $10^{18}$ atoms/c.c. and a p-type heavily doped collector region 18 of the same electronic properties as those of the emitter region 16. The collector region 18 serves as a gate region for a multi-drain static induction transistor comprising drain regions 19 formed with n-type heavily doped regions of an impurity concentration $10^{18}$ to $10^{20}$ atoms/c.c., a channel region formed of part of the n-type nearly intrinsic layer 14 and the source region 15. Or, alternatively, this collector region 18 may be contiguous to a gate region of such transistor. In this configuration, the collector region 18 is disposed separately from the gate region of the static induction transistor, and these regions are mutually interconnected electrically, by such means as a low resistivity polysilicon or metal wiring. Such configuration wherein the gate region and the collector region are contiguously arranged should be understood by those skilled in the art, and therefore it is not illustrated for the purpose of simplicity and saving the sheet of drawings. A device having this configuration exhibits performance substantially similar to that of the devices described above, though the packing density in such instance decreases slightly due to the separate provision of the collector region and the gate region. As is shown in FIGS. 6A and 6B, the gate region 18 is formed in a recessed portion and surrounds each of the effective channel portions of the multi-drain static induction transistor. Parasitic gate capacitance is thus suppressed to a low level and the high speed operation is enhanced further thereby. This recessed gate structure is also effective for obtaining a high transconductance since it is suitable for defining a very short channel and a short source-to-channel distance.

It is evident that the arrangement shown in FIGS. 6A and 6B operates in exactly the same fashion as IIL. In FIGS. 6A and 6B in which is shown "a unit" of a one-input, four-output inverter, the source 15 connected with the base 17 via the same conductivity-type region 14 is grounded, the emitter 16 is connected to a power supply to be supplied with a driving current, the gate 18 continuous with the collector is connected, as a logic input terminal, to a preceding stage (not shown) and the drains 19 are respectively connected, as logic output terminals, to respective succeeding stages (not shown). In case the gate 18 of an SIT (Static Induction Transistor) is adapted to be directly coupled to the drain of another circuit of a preceding stage which is arranged in substantially the same way as the arrangement of FIGS. 6A and 6B, then this SIT will effect "off-on" operation in corespondence with the "on-off" state of siad preceding stage. In such an instance, the lateral bipolar transistor which is comprised of regions 16, 17 and 18 operates substantially as a constant current supplying circuit. When the inversely operated SIT in the preceding circuit is in its "on" state, no electric current will be allowed to flow into the gate of the inversely operated SIT of this instant stage, whereas the inversely operated SIT in the preceding circuit is in its "off" state, an electric current is allowed to flow into the gate of the inversely operated SIT of this instant stage to raise the gate potential.

Figure 7:
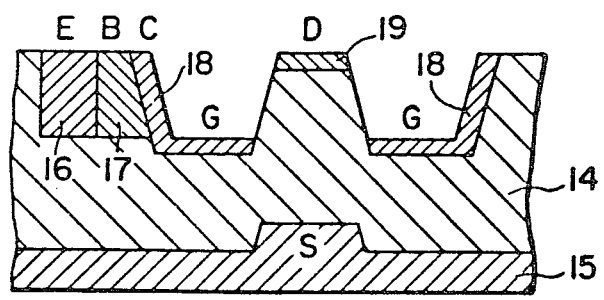
FIG. 7 is a diagrammatic section of a modification of the integrated circuit of FIGS. 6A and 6B.

FIG. 7 shows a modified structure in which the n-type heavily doped source region 15 is formed to project toward the drain region 19. Other portions are similar to those of FIGS. 6A and 6B. It will be understood that, by the provision of a "projection" in the source region, there are obtained the advantages such that the series resistance from the source up to the pinch-off point can be lowered without appreciably increasing the gate-source capacitance, that the transconductance $G_m$ can be increased, and that along therewith the transit time of the carriers from the source to the drain can be shortened. Thus, the high speed operation property of SIT can be all the more stressed.

Furthermore, the projecting heavily doped regions serves to prevent the deviation of the depletion layers established in the nearly intrinsic region 14. When the shape of the depletion layer is fixed irrespective of the signal voltage applied to the gate, the distortion in the signal transfer is improved.

The structures shown in FIGS. 6A, 6B and 7 are not limitative ones, but they are only given as illustrative examples. The impurity concentration, the conductivity type and the physical shapes of the respective regions may be altered appropriately as required.

Although the integrated circuit shown in FIGS. 6A and 6B has four outputs and hence four drain regions 19, the number of outputs can be arbitrarily selected according to the circuit design. Furthermore, the structures shown in FIGS. 6A, 6B and 7 correspond to each single IIL circuit unit. Any combination of such circuit units are possible.

Figure 8A:
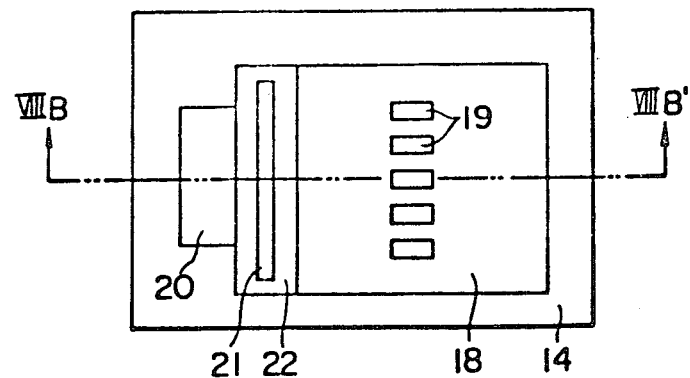
FIGS. 8A and 8B are a diagrammatic top-plan view and a section of an integrated circuit structure according to an embodiment of this invention.
Figure 8B:
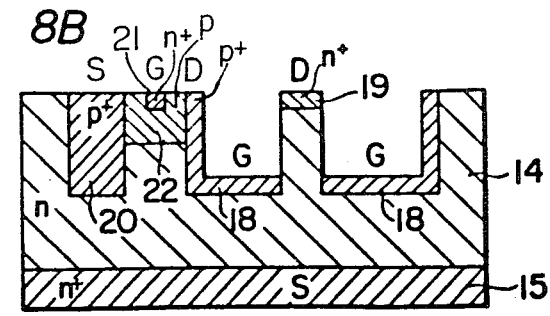

FIGS. 8A and 8B show another embodiment of an integrated circuit, in which both the injector transistor and the switching transistor of a five-output circuit are formed by static induction transistors. In these Figures, an n-type heavily doped source region 15 is formed in an n-type substrate and a nearly intrinsic n-type layer 14 is grown on the substrate. In the n-type layer 14, a p-type heavily doped source region 20 having an impurity concentration of $10^{18}$ to $10^{20}$ atoms/c.c., a p-type channel region 22 having an impurity concentration of $10^{13}$ to $10^{16}$ atoms/c.c., and a p-type heavily doped drain region 18 are formed to constitute the main part of one static induction transistor. An n-type heavily doped gate region 21 having an impurity concentration of $10^{18}$ to $10^{20}$ atoms/c.c. is formed in the p-type channel region 22. The drain region 18 serves also as the gate region of another static induction transistor including an n-type heavily doped drain 19 and the n-type source region 15. In this structure, the gate region 18 is arranged to be recessed from the principal surface. The impurity concentrations in the regions 14, 15, 18 and 19 may be similar to those of the structure of FIGS. 6A and 6B since these regions may be similar to those indicated by similar reference numerals in FIGS. 6A and 6B. In this embodiment, the source 20 is connected to a power supply; the gate 21 is directly connected to the source 20 or the drain 18, or to a separate voltage supply; the source 15 is grounded; the gate 18 is connected, as a logic input terminal, to a preceding stage (not shown); and the drains 19 are respectively connected, as logic output terminals, to respective succeeding stages (not shown). With a device in which both the injector transistor and the output transistor are formed with static induction transistors, respectively, it should be understood that, when the gate voltage potential of the gate of the output static induction transistor is at a high level and when, accordingly, this transistor is rendered to the "on" state, the injector static induction transistor which is connected to the gate is brought into a substantially "off" state, shutting off the current flowing therethrough. As a result, hardly any current is allowed to flow to the gate of the output static induction transistor, and there hardly is present the storage effect of minority carriers.

Figure 9:
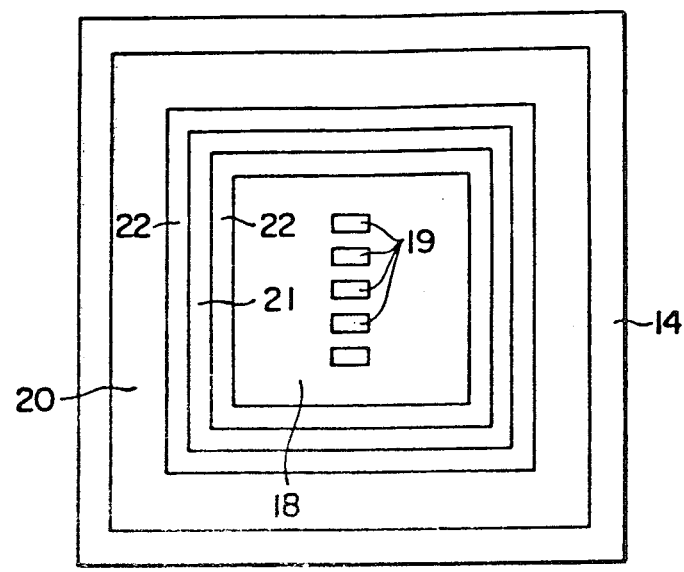
FIG. 9 is a diagrammatic top-plan view showing a modification of the integrated circuit of FIGS. 8A and 8B.

FIG. 9 shows a modification of the structure of FIGS. 8A and 8B, in which the source region 20, the gate region 21 and the channel region 22 of the injector static induction transistor are formed around the drain (gate) region 18. The operation is similar to that of the structure of FIGS. 8A and 8B and will be apparent from the foregoing description.

Description has been made above with respect to the cases wherein an inversely operated static induction transistor or transistors are adopted in composite IIL circuits. It will be appreciated that the present invention is not limited to the above circuits but can be applied to various integration circuits such as NTL and CML. It will be apparent also that various modifications and alterations of the foregoing embodiments are possible within the scope of this invention. For example, the injector bipolar transistor may have other shapes and impurity concentrations of the respective regions than those described above, for example the impurity concentration of the base region 17 can be equal to that of the region 14, or it may be replaced by a conventional field effect transistor. It will be needless to say that all the conductivity types of the respective regions may be reversed to form a device of an opposite conductivity type which functions in substantially the same way only if the polarity of the respective power supply source is reversed. In case the requirement for the high speed operation is not so severe, the recessed gate structure may be replaced by any of the conventional gate structures, for example the flat gate structure. In addition to rapid operation, this invention provides another advantage in the manufacture that the number of masks can be reduced and that the positional accuracy is somewhat less severe.

The manufacture of the integrated logic circuit structures of the foregoing embodiments will be described below taking the structure of FIGS. 6A and 6B as an example.

FIGS. 10A to 10J show various steps of the manufacture of the integrated circuit of FIGS. 6A and 6B.

Figure 10A:
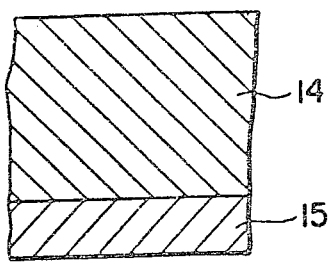
FIGS. 10A to 10J are diagrammatic sections showing various steps of the manufacture of the structure shown in FIGS. 6A and 6B.

First, on an n-type silicon substrate 15 having a high impurity concentration, an n-type layer 14 of a low impurity concentration of 3 to $5 \times 10^{13}$ atoms/c.c. is grown by relying on the epitaxial technique to a thickness of about 5 micrometers (FIG. 10A). This epitaxial growth is achieved by flowing mixed gas of undoped monosilane ($SiH_4$) and hydrogen ($H_2$) to a silicon substrate 15 heated to 1000° C. to decompose monosilane and deposit silicon thereon.

Figure 10B:
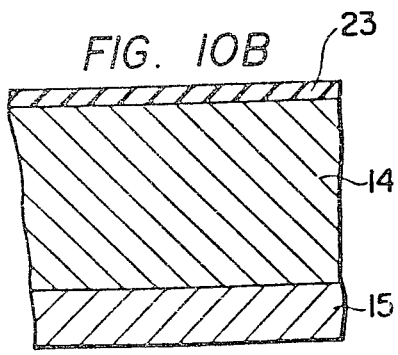
Figure 10C:
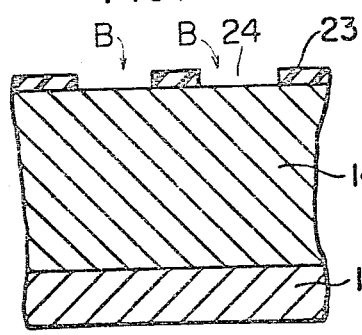

Next, a mixed gas of monosilane ($SiH_4$) and oxygen ($O_2$) is decomposed at 500° C. to deposit a silicon dioxide ($SiO_2$) film 23 on the surface of the epitaxial layer 14 to a thickness of about 300 nm by relying on the chemical vapor deposition technique (FIG. 10B).

Then, a window 24 for diffusing the gate region is opened at an appropriate portion of the silicon dioxide ($SiO_2$) film 23 (FIG. 10C) thus formed.

Figure 10D:
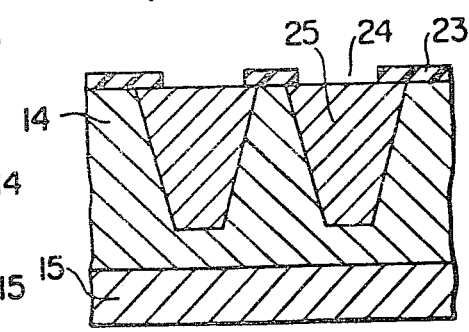

Boron is diffused into the epitaxial layer 14 from the mixed atmosphere of $BBr_3$, $N_2$ and $O_2$ to form a boron diffused region 25 (FIG. 10D). The dimension of the window 24 formed in the silicon dioxide film is determined based on the consideration that the diffusion speed of the impurity in the lateral direction is of an order similar to that in the vertical direction.

Figure 10E:
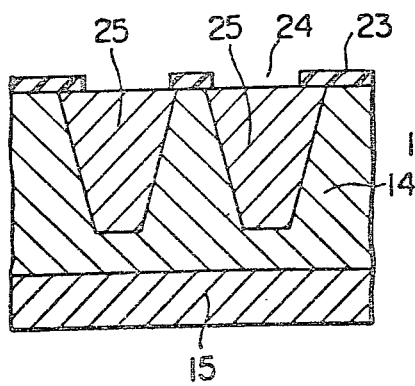

Then, using the usual photoetching technique, a larger window than before (step of FIG. 10C) is formed in the silicon dioxide ($SiO_2$) film 23 (FIG. 10E).

Figure 10F:
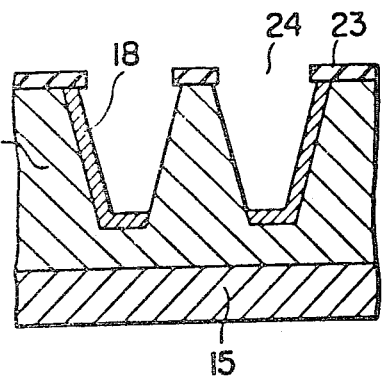

Part of the boron diffused region 25 is etched away by relying on the selective etching technique, and the gate electrode 18 is deposited thereon (FIG. 10F). The selective etching may be achieved by the use of the mixed solution of fluoric acid (HF) and nitric acid ($HNO_3$), but more preferably by relying on the plasma etching of $CF_4$ in which the side etching (under-cut) is minimized and grooves can be precisely formed. Furthermore, the location and the dimension of the window in the silicon dioxide film 23 should be so designed that the boron-diffused layer 25 is etched away as shown in FIG. 10F to leave exposed drain projections.

Figure 10G:
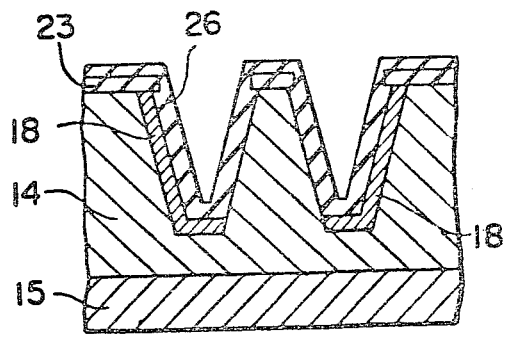

Then, another silicon dioxide ($SiO_2$) film 26 is formed by relying on the chemical vapor deposition technique (FIG. 10G).

Figure 10H:
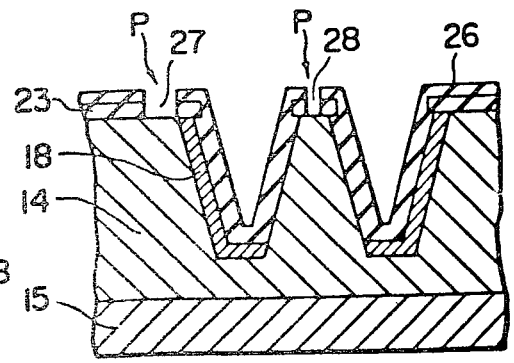

Windows 27 and 28 for forming the base region 17 and the drain region 19 are formed through the silicon dioxide films 26 and 23 (FIG. 10H).

Figure 10I:
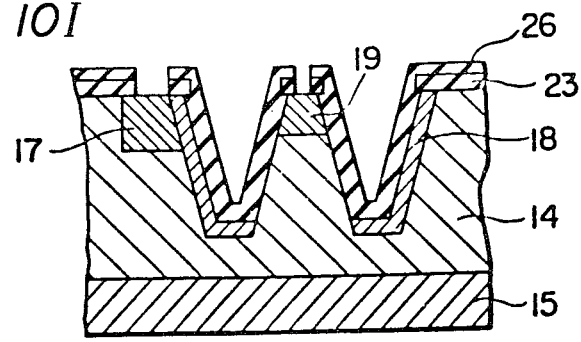

Phosphorus is diffused through the windows 27 and 28 from the mixed atmosphere of $POCl_3$, $N_2$ and $O_2$ at 1000° C. to form the base region 17 and the drain region 19 (FIG. 10I).

Figure 10J:
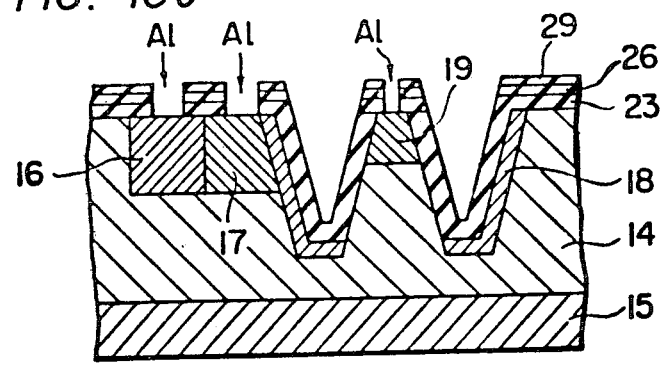

Then, another silicon dioxide ($SiO_2$) film 29 is formed on the surface by the chemical vapor deposition. The emitter region 16 is formed by relying on the photoetching and the boron diffusion technique (FIG. 10J).

Thereafter, windows are formed through the silicon dioxide ($SiO_2$) films 23, 26 and 29 in the portions of the metal electrodes by relying on the photoetching technique. Aluminum is vacuum-deposited thereon, and the respective electrodes are formed by a selective etching of the Al layer. On the rear surface, since no silicon dioxide ($SiO_2$) film is formed intentionally and hence impurities are inevitably doped by the above processes, the doped layer is removed by etching in mixed solution of fluoric acid (HF) and nitric acid ($HNO_3$), etc. Then, aluminum is deposited thereon to form a source electrode not shown. Alternatively, the source electrode can be formed on the same principal surface with other electrodes by removing part of the epitaxial layer 14 by relying on the selective etching from the side of the epitaxial layer 14 to expose the source region 15 and depositing an electrode thereon.

It will be apparent that the above manufacturing processes are only an example and can be altered in various ways. For example, the oxide ($SiO_2$) layer may be formed by relying on the thermal oxidation or the sputtering as well as the chemical vapor deposition techniques. The selective etching may be achieved by relying on any one of the immersion etching technique using a mixed solution of fluoric acid (HF) and nitric acid ($HNO_3$) or an aqueous solution of sodium hydroxide (NaOH) or potassium hydroxide (KOH), the plasma etching using $CF_4$ gas, etc., the sputter etching technique, the selective etching technique utilizing selective oxidation using a silicon nitride ($Si_3H_4$) film as a mask, etc. In such cases, details of the manufacturing processes should be altered or modified according to the techniques adopted.

Next, an example of the manufacturing process of the structure having a projecting source region as in FIG. 7 will be described by referring to FIGS. 11A to 11C.

First, a silicon substrate 15 having a high n-type impurity concentration is thermally oxidized at 1200° C. to grow an oxide film to a thickness of about one micrometer. The oxide film is selectively etched by relying on the usual photoetching technique to leave a predetermined portion 30 (FIG. 11A).

Then, the substrate 15 is again subjected to thermal oxidation. Since the oxidation rate of the substrate under the oxide film 30 is lower than that in the other portion, oxidation proceeds as shown in FIG. 11B. Namely, the exposed portion of the silicon substrate is oxidized more deeply to grow an oxide film 31.

Figure 11A:
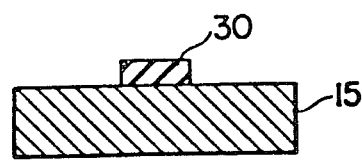
FIGS. 11A to 11C are diagrammatic sections showing various steps of the manufacture of the structure of FIG. 7.
Figure 11B:
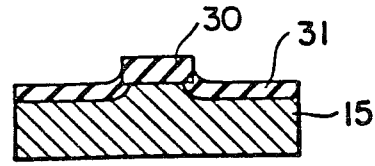
Figure 11C:
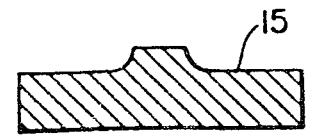

When the oxide films 30 and 31 are etched away by fluoric acid (HF), a mesa-like structure as shown in FIG. 11C appears. The projection is about 0.6 micrometer in one example. On such shaped substrate, an epitaxial layer 14 is grown and similar processes as described above are followed.

Alternatively, the oxide film 30 as shown in FIG. 11A may be used as a mask for the selective etching. Then, the resulting structure will be similar to that shown in FIG. 11C.

Figure 12A:
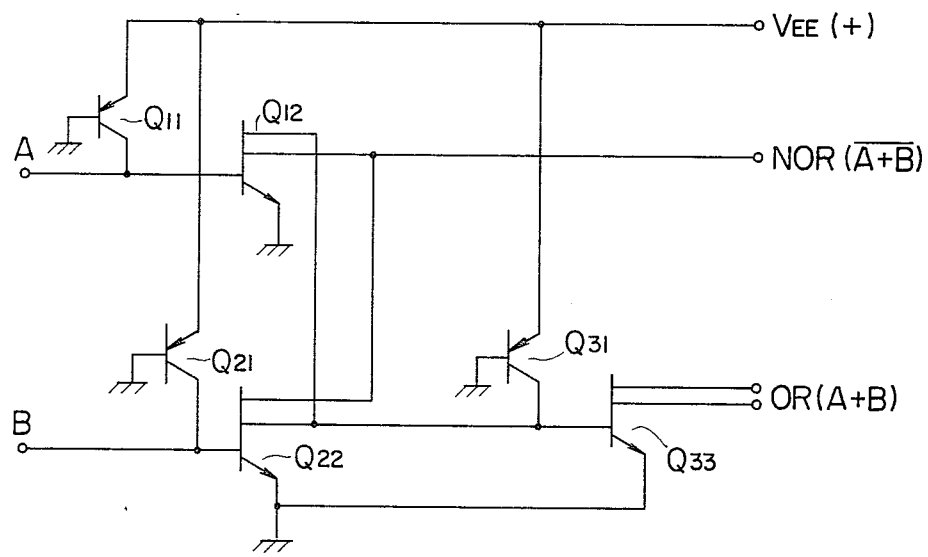
FIGS. 12A and 12B are a circuit diagram and a diagrammatic plan view of an integrated NOR/OR circuit structure.
Figure 12B:
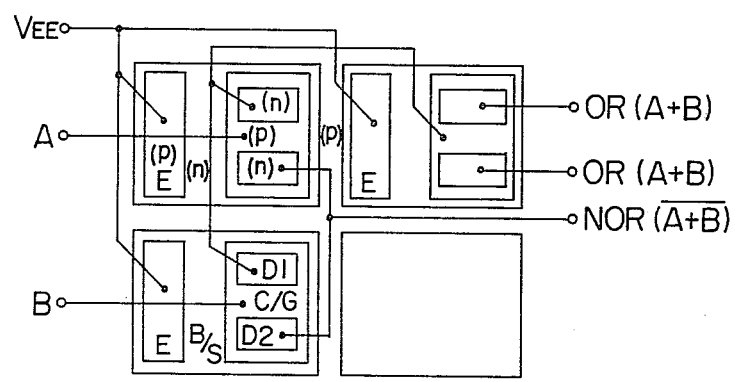

How, description will be made briefly of the correlation of the IIL units in an integrated circuit. FIGS. 12A and 12B show an NOR/OR circuit formed by three circuit units according to this invention. In FIG. 12A, injector transistors $Q_{11}$, $Q_{21}$ and $Q_{31}$ are formed with bipolar transistors, and switching transistors $Q_{12}$, $Q_{22}$ and $Q_{32}$ are formed with static induction transistors. Each pair of injector and switching transistors $Q_{11}$, $Q_{12}$, $Q_{21}$, $Q_{22}$ or $Q_{31}$, $Q_{32}$ forms one circuit unit. The bases of the injector transistors and the sources of the switching transistors are commonly grounded through the semiconductor substrate. Wirings are done among the emitters of the injector transistors and the gates and the drains of the switching static induction transistors as shown in FIG. 12B. Each circuit unit is surrounded by isolating p-type regions except for the bottom common n-type substrate. The isolation may also be achieved by oxide or insulator regions.

A 15 stage ring oscillator according this invention is easily obtained by using four masks, and it exhibits a propagation delay characteristic less than 3.5 nsec.

What is claimed is:

1. A semiconductor integrated circuit structure formed in a single semiconductor chip having one principle surface and including a plurality of active elements, comprising at least one static induction transistor (SIT) as one of said active elements, and a transistor, having first and second portions defining a current path therebetween and a control portion for controlling current flow through said path, as another one of said active elements, said static induction transistor including at least one drain comprised of a heavily-doped region having a certain conductivity type formed in said chip adjacent said principle surface,
a first semiconductor region having said certain conductivity type and having a low impurity concentration; and a source composed of a heavily-doped region having said certain conductivity type formed in said chip adjacent, and being disposed adjacent said first semiconductor region opposite said drain for allowing a current to flow through said first region between said source and drain,
said integrated structure comprising means for functioning both as a gate structure for said SIT and as said second portion of said another of said plurality of active elements, including a heavily-doped region having another conductivity type opposite to said certain conductivity type, adapted for being applied with input signals of different levels and disposed adjacent to said first semiconductor region to define a short channel in said first semiconductor region is open at one input signal and closed at another input signal level.

2. A semiconductor integrated circuit structure according to claim 1, wherein: said short channel is disposed beneath said drain in said semiconductor chip so as to be aligned substantially perpendicular to said one principle surface.

3. A semiconductor integrated circuit structure according to claim 2, wherein: said source heavily-doped semiconductor region comprises buried region extending substantially parallel to and spaced from said one principle surface.

4. A semiconductor integrated circuit structure according to claim 3, wherein: said source region includes a portion projecting toward said drain semiconductor region.

5. A semiconductor integrated circuit structure according to claim 1, wherein: said static induction transistor comprises a plurality of drain regions disposed in said one principal surface of said semiconductor chip and said gate structure defines a channel between each said drain and said source.

6. A semiconductor integrated circuit structure according to claim 5, wherein: said semiconductor chip has a portion recessed from said one principal surface except for those portions where said plurality of drain regions are formed, and said fourth semiconductor region is formed in the bottom surface of said recessed portion.

7. A semiconductor integrated circuit structure according to claim 1, further comprising: a bipolar transistor including an emitter region of said another conductivity type, a base region of said certain conductivity type and a collector region of said another conductivity type electrically connected to said gate structure.

8. A semiconductor integrated circuit structure according to claim 5, further comprising: a bipolar transistor including an emitter region of said another conductivity type, a base region of said certain conductivity type and a collector region of said another conductivity type continuous to said fourth semiconductor region.

9. A semiconductor integrated circuit structure according to claim 8, wherein: said base region is electrically connected to said first semiconductor region.

10. A semiconductor integrated circuit structure according to claim 9, wherein: said emitter region is disposed in said one principal surface.

11. A semiconductor integrated circuit structure according to claim 1, further comprising: another static induction transistor including another source and another drain electrically connected to said gate.

12. A semiconductor integrated circuit structure according to claim 5, further comprising: another static induction transistor including a source region of said another conductivity type disposed in said one principal surface and a drain region of said another conductivity type disposed continuous to said fourth semiconductor region.

13. A semiconductor integrated circuit structure formed in a single semiconductor chip, comprising: a plurality of circuit units, each said circuit unit including at least one static induction transistor and at least one bipolar transistor, comprising: a heavily-doped common semiconductor region of a certain conductivity type serving as a source region of said static induction transistor and a base region of said bipolar transistor, a nearly intrinsic semiconductor region disposed on said common semiconductor region, a heavily-doped gate-and-collector region of another conductivity type opposite to said certain conductivity type formed in said nearly intrinsic semiconductor region, said heavily-doped gate-and-collector region serving as a gate region of said static induction transistor and concurrently serving as a collector region of said bipolar transistor, a heavily-doped drain region of said certain conductivity type disposed on said nearly instrinsic semiconductor region for each of said channel, a base region of said certain conductivity type disposed adjacent to said gate-and-collector region, and a heavily-doped emitter region of said another conductivity type disposed adjacent to said base region.

14. A semiconductor integrated circuit structure according to claim 13, wherein: said nearly intrinsic semiconductor region has said certain conductivity type and is electronically continuous to said base region.

15. A semiconductor integrated circuit structure according to claim 14, wherein: said drain region and said emitter region are exposed on a same principal surface of said semiconductor chip.

16. A semiconductor integrated circuit structure according to claim 15, wherein: said gate-and-collector region is exposed on said principal surface of said semiconductor chip.

17. A semiconductor integrated circuit structure according to claim 16, wherein: said gate-and-collector region in one said unit is electrically connected to said drain region of another said unit.

18. A semiconductor integrated circuit structure according to claim 16, further comprising: an isolating semiconductor region of said another conductivity type surrounding each said unit and extending from said principal surface to said source region.

19. A semiconductor integrated circuit structure according to claim 16, further comprising: an isolating insulator region surrounding each said unit and extending from said principal surface to said source region.

20. A semiconductor device comprising a first transistor having first and second elements defining a current path therebetween, and a control element for controlling current flow through said path, and a static induction transistor (SIT) formed in a single semiconductor body having first and second opposing principle surface, said device comprising:
means for functioning as said source element including a heavily-doped source semiconductor region of a first conductivity type disposed in said body adjacent said first principle surface;
means for functioning as said drain element disposed adjacent to said second principle surface;
means for functioning as said first transistor first element including a heavily-doped first semiconductor region of a second conductivity type opposite to said first conductivity type disposed adjacent to said second principle surface spaced apart from said drain element,
means for functioning as said first transistor control element disposed adjacent to said second principle surface between said first semiconductor region and said drain element; and
means for functioning both as said first transistor second element and said SIT gate element including a third heavily-doped semiconductor disposed between said second semiconductor region and said drain element.

21. The device of claim 20 wherein said means for functioning as said drain element includes a heavily-doped drain semiconductor region of said first conductivity type.

22. The device of claims 20 or 21 wherein said means for functioning as said first transistor control element includes a heavily-doped second semiconductor region of said first conductivity type.

23. The device of claim 20 wherein said first transistor is a bipolar transistor.

24. The device of claim 20 wherein said first transistor is a second SIT.

* * * * *